(12) United States Patent
Curtis et al.

(10) Patent No.: US 12,213,278 B2
(45) Date of Patent: Jan. 28, 2025

(54) PROCESSOR LOAD PLATE FOR TWO-PHASE LIQUID IMMERSION COOLING

(71) Applicant: Dell Products L.P., Round Rock, TX (US)

(72) Inventors: Robert B. Curtis, Georgetown, TX (US); Richard M. Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 201 days.

(21) Appl. No.: 17/869,832

(22) Filed: Jul. 21, 2022

(65) Prior Publication Data

US 2024/0032234 A1 Jan. 25, 2024

(51) Int. Cl.
*H05K 7/20* (2006.01)
*H05K 7/10* (2006.01)

(52) U.S. Cl.
CPC .......... *H05K 7/20154* (2013.01); *H05K 7/10* (2013.01); *H05K 7/203* (2013.01)

(58) Field of Classification Search
CPC .......... G06F 1/183; G06F 1/184; G06F 1/185; G06F 1/186; G06F 1/187; G06F 1/206; H01L 23/4006; H01L 2023/4087; H01L 23/4093; H01L 2023/4081; H01L 2023/405; H01L 2023/4068; H01L 23/32; H01L 23/40; H01L 23/433; H05K 3/301; H05K 2201/2018; H05K 7/20418; H05K 1/0201; H05K 2201/10325; H05K 2201/10409; H05K 3/30; H05K 5/00; H05K 7/12; H05K 7/1417; H05K 7/20445; H05K 7/2049; F28D 15/0233; H01R 4/5066; H01R 13/62; H01R 13/639; H01R 12/7023; H01R 12/7047
See application file for complete search history.

(56) References Cited

U.S. PATENT DOCUMENTS

| | | | | |
|---|---|---|---|---|
| 7,121,865 | B2* | 10/2006 | Bryant | H05K 7/1053 439/342 |
| 10,978,372 | B1* | 4/2021 | Tong | H05K 1/0204 |
| 11,460,895 | B2* | 10/2022 | Hobbs | H05K 7/2039 |
| 2009/0004902 | A1* | 1/2009 | Pandey | F28D 15/0233 439/729 |
| 2010/0330824 | A1* | 12/2010 | Ulen | H05K 7/1053 29/527.5 |

(Continued)

*Primary Examiner* — Michael A Matey
(74) *Attorney, Agent, or Firm* — Jackson Walker L.L.P.

(57) ABSTRACT

An information handling system may include a motherboard, an information handling resource, a heat spreader thermally coupled to the information handling resource, and a load plate mechanically coupled to the motherboard in order to maintain electrical and mechanical coupling of the information handling resource to the motherboard. The load plate may include a body at least partially overlapping with and mechanically coupled to the heat spreader when the load plate is mechanically coupled to the motherboard, an opening formed within the body and configured to expose the heat spreader through the opening when the load plate is mechanically coupled to the motherboard, and an angled feature formed at one edge of a perimeter of the opening and decreasing in depth from the opening to the body.

10 Claims, 6 Drawing Sheets

(56) References Cited

U.S. PATENT DOCUMENTS

| | | | |
|---|---|---|---|
| 2014/0048924 A1* | 2/2014 | Lee | H01L 23/3672 257/713 |
| 2014/0092573 A1* | 4/2014 | Llapitan | H05K 7/1007 257/E23.179 |
| 2014/0162473 A1* | 6/2014 | Aoki | H05K 7/1061 29/832 |
| 2014/0199873 A1* | 7/2014 | Liu | H01R 43/205 29/831 |
| 2015/0176911 A1* | 6/2015 | Brunschwiler | H05K 7/20254 165/104.31 |
| 2016/0205784 A1* | 7/2016 | Kyle | H05K 3/301 361/679.02 |
| 2016/0314091 A1* | 10/2016 | Dutt | G11C 14/0018 |
| 2018/0093465 A1* | 4/2018 | Kyle | B32B 43/006 |
| 2018/0332735 A1* | 11/2018 | Wei | H05K 7/20263 |
| 2019/0223324 A1* | 7/2019 | Le | H05K 7/20263 |
| 2019/0304871 A1* | 10/2019 | Laido | H05K 1/021 |
| 2019/0393631 A1* | 12/2019 | Haswarey | G06F 1/20 |
| 2021/0193558 A1* | 6/2021 | Miele | H05K 7/20709 |
| 2021/0318734 A1* | 10/2021 | Hoffmeyer | H01L 23/373 |
| 2022/0369512 A1* | 11/2022 | Kitamura | H01L 23/4006 |
| 2023/0069684 A1* | 3/2023 | Kitamura | G06F 1/203 |
| 2023/0315171 A1* | 10/2023 | Ahrens | H05K 5/03 361/679.46 |

* cited by examiner

PROCESSOR LOAD PLATE FOR TWO-PHASE LIQUID IMMERSION COOLING

TECHNICAL FIELD

The present disclosure relates in general to information handling systems, and more particularly to mechanical loading of a processor or other device in a liquid-immersion cooled information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

However, in some instances, some information handling systems may generate a high level of heat such that traditional air mover-based cooling solutions may be insufficient to provide adequate cooling. In such instances, liquid cooling of information handling systems may be preferred, including a technique known as liquid-immersion cooling. In liquid-immersion cooling, an information handling system server rack may be filled with a dielectric liquid (e.g., an electrically-nonconductive oil or other fluid) and individual information handling system servers may be vertically inserted into the rack. Such dielectric fluid may be actively cooled (e.g., using known liquid refrigeration or heat exchange techniques) and in operation, heat may be transferred from the information handling system servers to the dielectric liquid, thus cooling the information handling system servers and their constituent components.

Some liquid immersion cooling systems may also employ two-phase immersion cooling, in which a phase transition from liquid to gas may be desired at components that generate exceptional amounts of heat, such that additional cooling of such components is provided due to the latent heat associated with the phase transition from liquid to gas of the coolant fluid. One technique to maximize performance of two-phase immersion cooling application is to apply a boiling enhancement coating to heat-rejecting media (e.g., cold plates, heat sinks, etc.) to promote nucleation of the fluid. Existing solutions for promoting two-phase cooling proximate to processors often employ a combination mechanical loading plate with a boiling plate coated with boiling enhancement coating in order to provide mechanical retention as required to electrically couple the processor to its associated socket. The use of such a combination mechanical loading plate with a boiling plate may add thermal resistance to the overall system and degrade overall thermal performance.

SUMMARY

In accordance with the teachings of the present disclosure, the disadvantages and problems associated with existing approaches to two-phase liquid-immersion cooled information handling systems may be substantially reduced or eliminated.

In accordance with embodiments of the present disclosure, an information handling system may include a motherboard, an information handling resource, a heat spreader thermally coupled to the information handling resource, and a load plate mechanically coupled to the motherboard in order to maintain electrical and mechanical coupling of the information handling resource to the motherboard. The load plate may include a body at least partially overlapping with and mechanically coupled to the heat spreader when the load plate is mechanically coupled to the motherboard, an opening formed within the body and configured to expose the heat spreader through the opening when the load plate is mechanically coupled to the motherboard, and an angled feature formed at one edge of a perimeter of the opening and decreasing in depth from the opening to the body.

In accordance with these and other embodiments of the present disclosure, a load plate configured to mechanically couple to a motherboard in order to maintain electrical and mechanical coupling of an information handling resource to the motherboard may be provided. The load plate may include a body configured to at least partially overlap with and mechanically couple to a heat spreader thermally coupled to the information handling resource when the load plate is mechanically coupled to the motherboard, an opening formed within the body and configured to expose the heat spreader through the opening when the load plate is mechanically coupled to the motherboard, and an angled feature formed at one edge of a perimeter of the opening and decreasing in depth from the opening to the body.

In accordance with these and other embodiments of the present disclosure, a method for forming a load plate configured to mechanically couple to a motherboard in order to maintain electrical and mechanical coupling of an information handling resource to the motherboard may be provided. The method may include forming a body configured to at least partially overlap with and mechanically couple to a heat spreader thermally coupled to the information handling resource when the load plate is mechanically coupled to the motherboard, forming an opening within the body and configured to expose the heat spreader through the opening when the load plate is mechanically coupled to the motherboard, and forming an angled feature at one edge of a perimeter of the opening and decreasing in depth from the opening to the body.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1A:
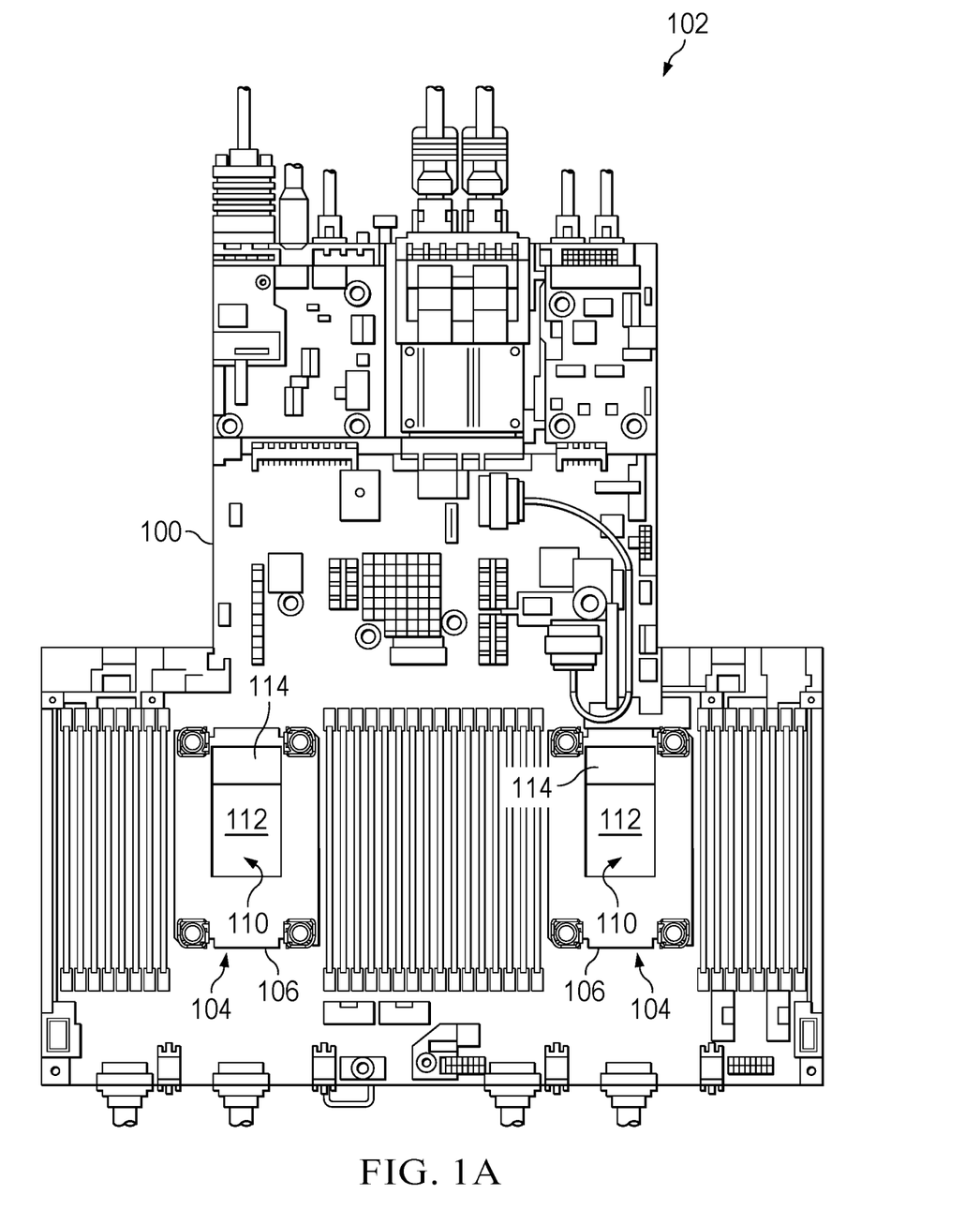
FIG. 1A illustrates an elevation view of an example information handling system, in accordance with embodiments of the present disclosure.
Figure 1B:
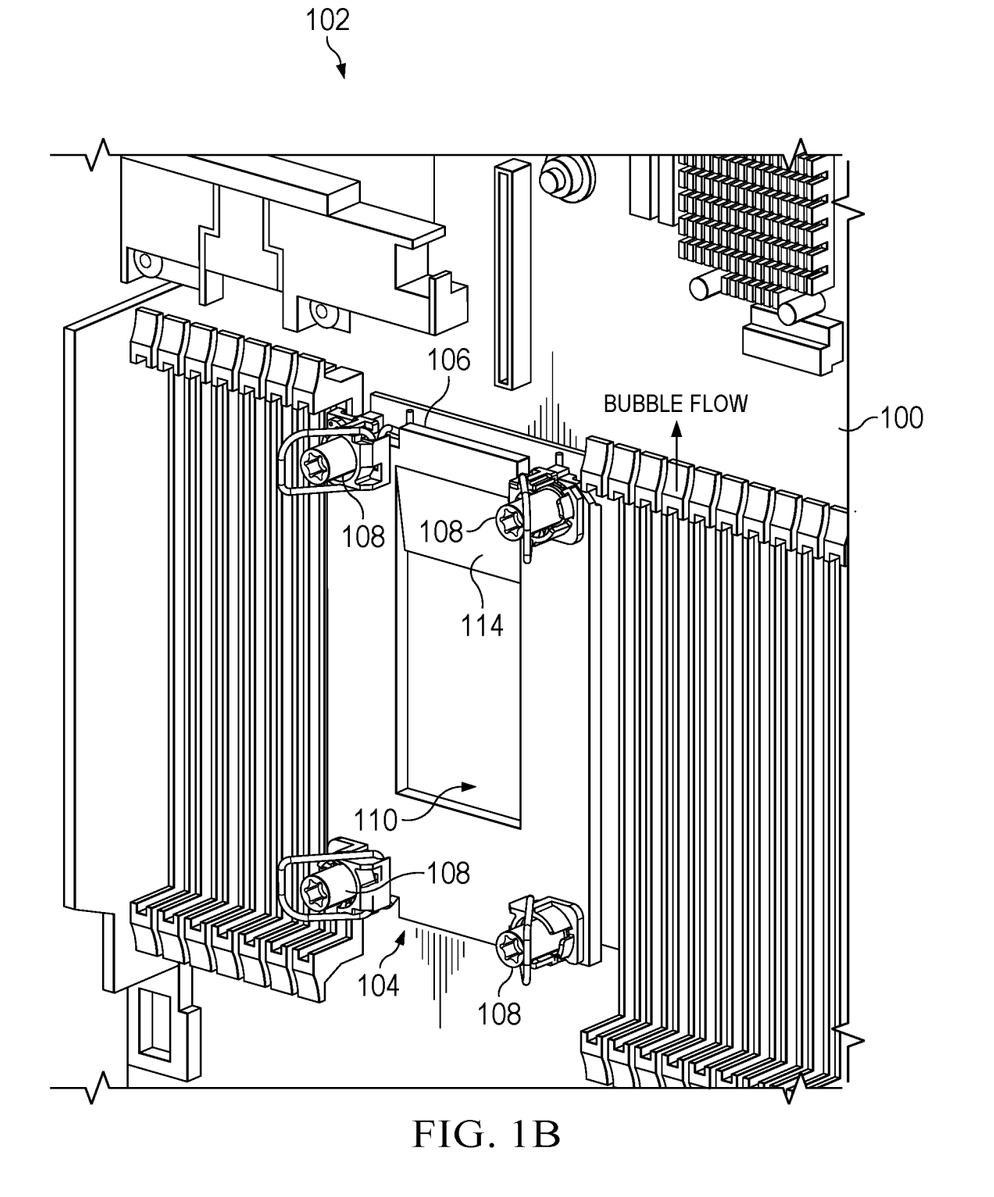
FIG. 1B illustrates a zoomed-in isometric perspective view of selected portions of the example information handling system of FIG. 1A, in accordance with embodiments of the present disclosure.

FIG. 1A illustrates an elevation view of an example information handling system 102, in accordance with embodiments of the present disclosure. FIG. 1B illustrates a zoomed-in isometric perspective view of selected portions of example information handling system 102, in accordance with embodiments of the present disclosure. In some embodiments, information handling system 102 may comprise a server or "blade." As shown in FIGS. 1A and 1B, information handling system 102 may comprise a motherboard 100 with a plurality of information handling resources mechanically and electrically coupled thereto, including without limitation one or more processors, wherein each processor which may be maintained in mechanical and electrical contact with motherboard 100 via an associated load plate 104.

Load plate 104 may comprise any suitable system, device, or apparatus configured to provide mechanical loading between a processor and motherboard 100, to ensure electrical connectivity between electrical contacts of the processor (e.g., pins, bumps, etc.) and corresponding electrical contacts of a socket formed within or otherwise mounted on motherboard 100. As shown in FIGS. 1A and 1B, load plate 104 may include a body 106, which may be formed from metal or other suitable material, and mechanical fasteners 108 for mechanically coupling load plate 104 to another mechanical structure (e.g., motherboard 100), thus applying a mechanical force between load plate 104 and motherboard 100 to ensure electrical mating of a processor to its associated socket. As also shown in FIGS. 1A and 1B, load plate 104 may be generally flat in shape (e.g., significantly smaller in one dimension as compared to its other two dimensions). Although depicted as being rectangular in shape in FIGS. 1A and 1B, load plate 104 may be of any suitable shape. As further shown in FIGS. 1A and 1B, load plate 104 may include an opening 110 in the middle thereof through which a heat spreader 112 of a processor may be exposed. Such heat spreader 112 may include an integrated boiling enhancement coating in the region of heat spreader 112 exposed through opening 110.

Additionally, as shown in FIGS. 1A and 1B, load plate 104 may include proximate to the top edge of opening 110 (as information handling system 102 would be viewed while inserted vertically into a liquid immersion tank), an angled feature 114 that gradually decreases in depth from the bottom of such angled feature 114 to the top of such angled feature 114. As indicated in FIG. 1B, gaseous bubbles formed within coolant liquid at heat spreader 112 and within opening 110 may flow upward (e.g., opposite to gravity) due to such gaseous bubbles having lower density than the coolant liquid that remains in liquid phase. Accordingly, angled feature 114 may minimize obstructions by solid portions of load plate 104 or other structures that could impede the upward flow of such gaseous bubbles, permitting such bubbles to flow away from heat spreader 112 and for more liquid-phase coolant to come into contact with heat spreader 112.

Figure 2:
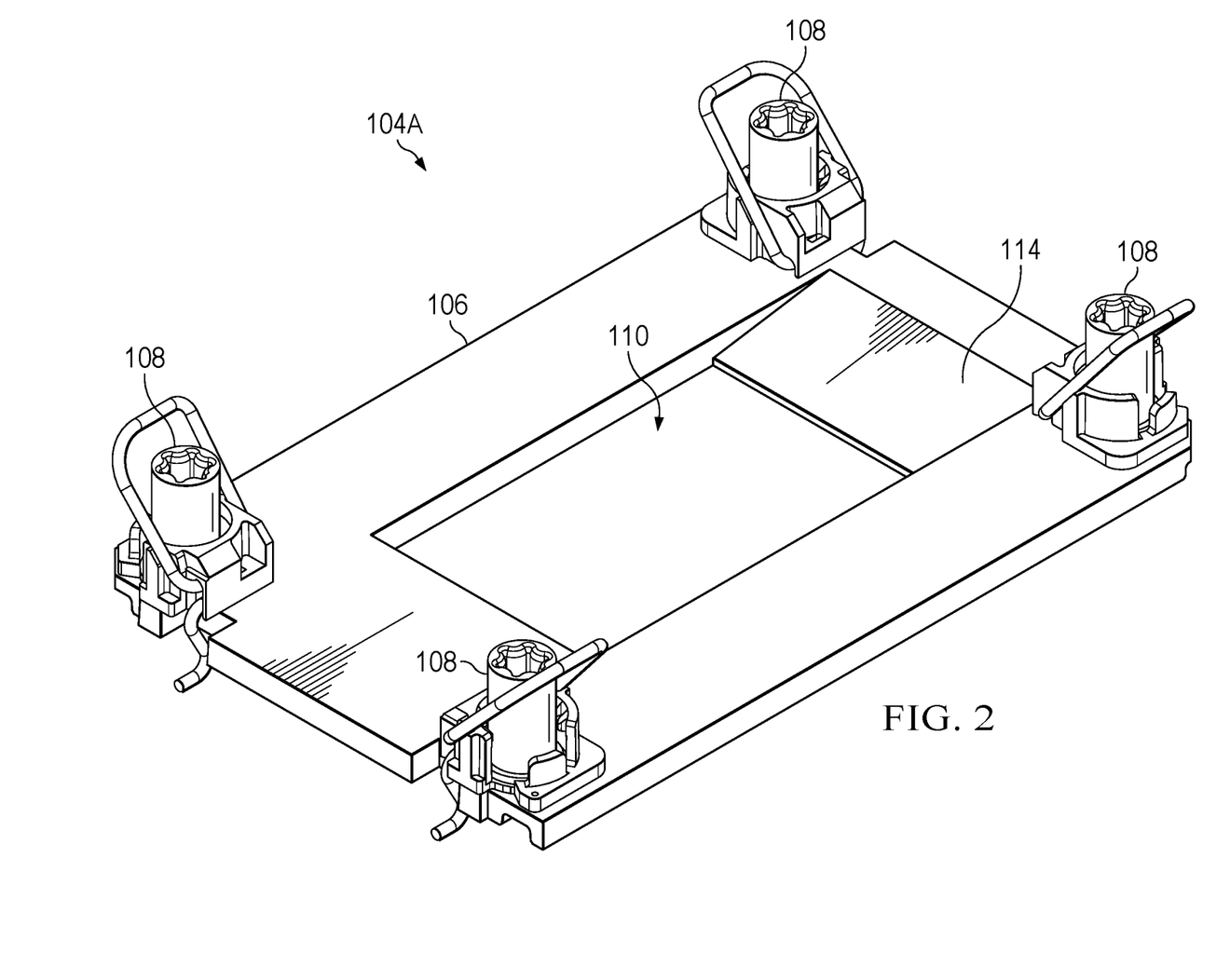
FIG. 2 illustrates an isometric perspective view of selected portions of an example load plate, in accordance with embodiments of the present disclosure.

FIG. 2 illustrates an isometric perspective view of selected portions of an example load plate 104A, in accordance with embodiments of the present disclosure. In some embodiments, load plate 104A may be used to implement load plates 104 depicted in FIGS. 1A and 1B. FIG. 2 shows greater detail of features of load plates 104 shown in FIGS. 1A and 1B, including body 106, mechanical fasteners 108, opening 110, and angled feature 114.

Figure 3:
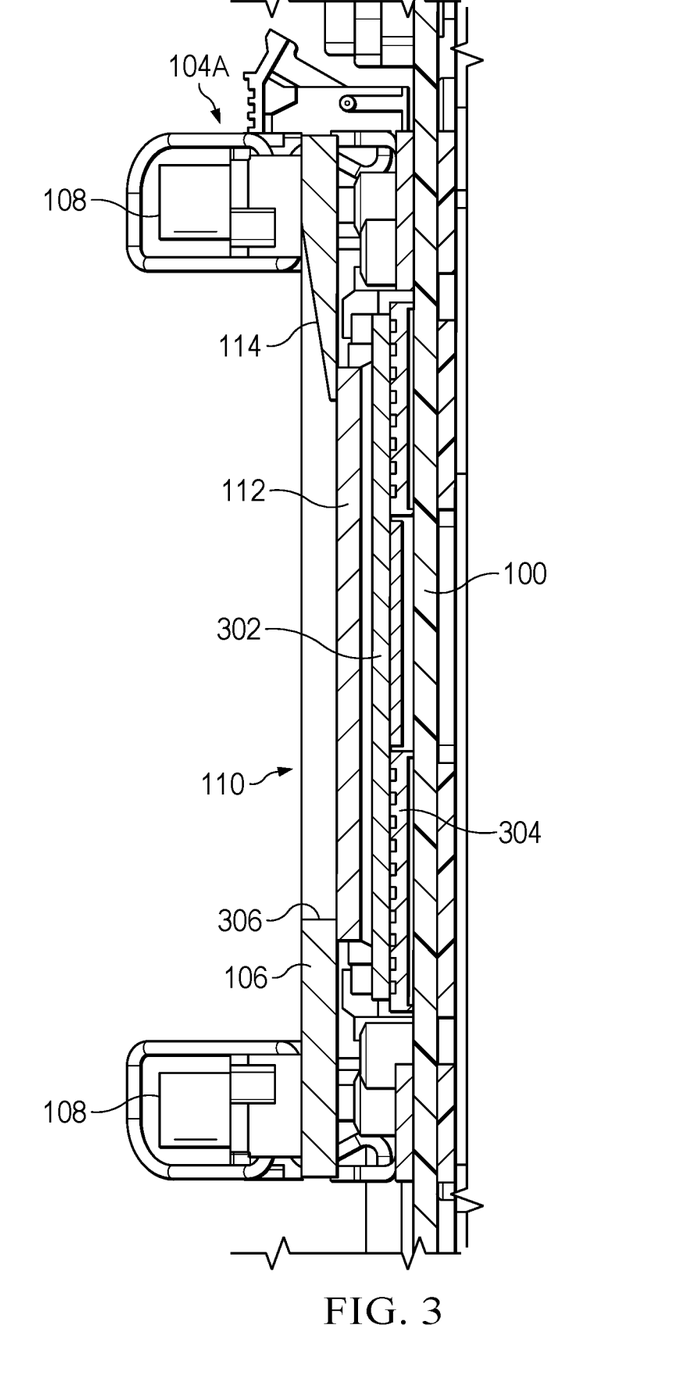
FIG. 3 illustrates a side cross-sectional elevation view of a load plate mechanically coupled to a motherboard, in accordance with embodiments of the present disclosure.

FIG. 3 illustrates a side cross-sectional elevation view of load plate 104A mechanically coupled to motherboard 100, in accordance with embodiments of the present disclosure. As shown in FIG. 3, load plate 104A may be mechanically coupled to motherboard 100 via fasteners 108, which may provide mechanical loading to mechanically retain a processor 302 in contact with a corresponding socket 304 of motherboard 100. For purposes of exposition, the side of load plate 104A is depicted as optically transparent (even though load plate 104A may be optically opaque in actual implementation), in order to depict angled feature 114 and bottom 306 of opening 110. As shown in FIG. 3, body 106 may overlay and contact heat spreader 112 proximate to a perimeter of opening 110 in order to provide the needed mechanical loading to maintain mechanical loading of processor 302 to socket 304.

Figure 4:
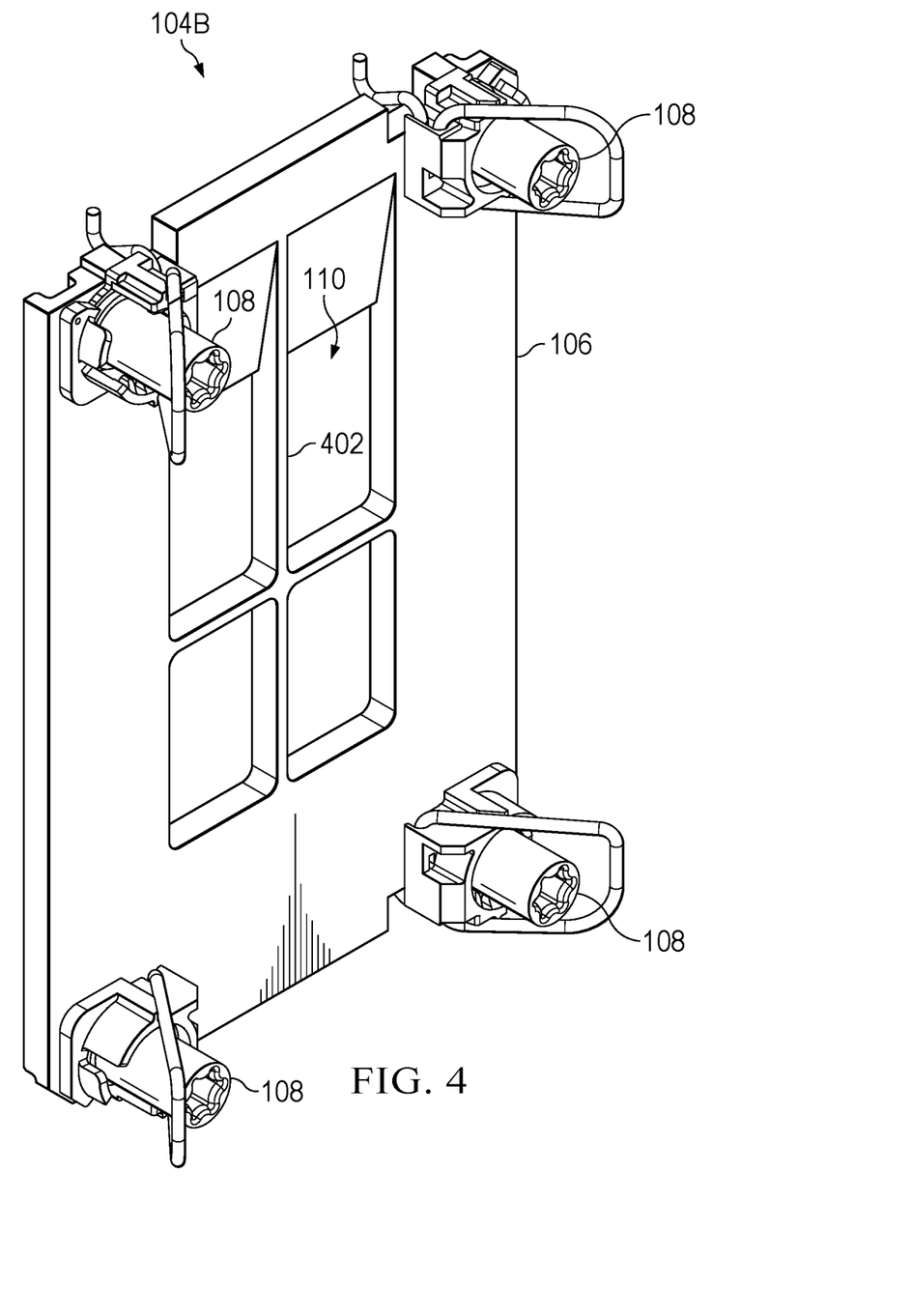
FIG. 4 illustrates an isometric perspective view of selected portions of another example load plate, in accordance with embodiments of the present disclosure.

FIG. 4 illustrates an isometric perspective view of selected portions of an example load plate 104B, in accordance with embodiments of the present disclosure. In some embodiments, load plate 104B may be used to implement load plates 104 depicted in FIGS. 1A and 1B. Load plate 104B depicted in FIG. 4 may be similar in many respects to load plate 104A depicted in FIG. 2. Accordingly, only the main difference between load plate 104A and load plate 104B may be described below.

In particular, load plate 104B may include stiffening features 402 extending from body 106 at the perimeter of opening 110 and formed within opening 110 in order to provide additional mechanical stiffness to load plate 104B.

Figure 5:
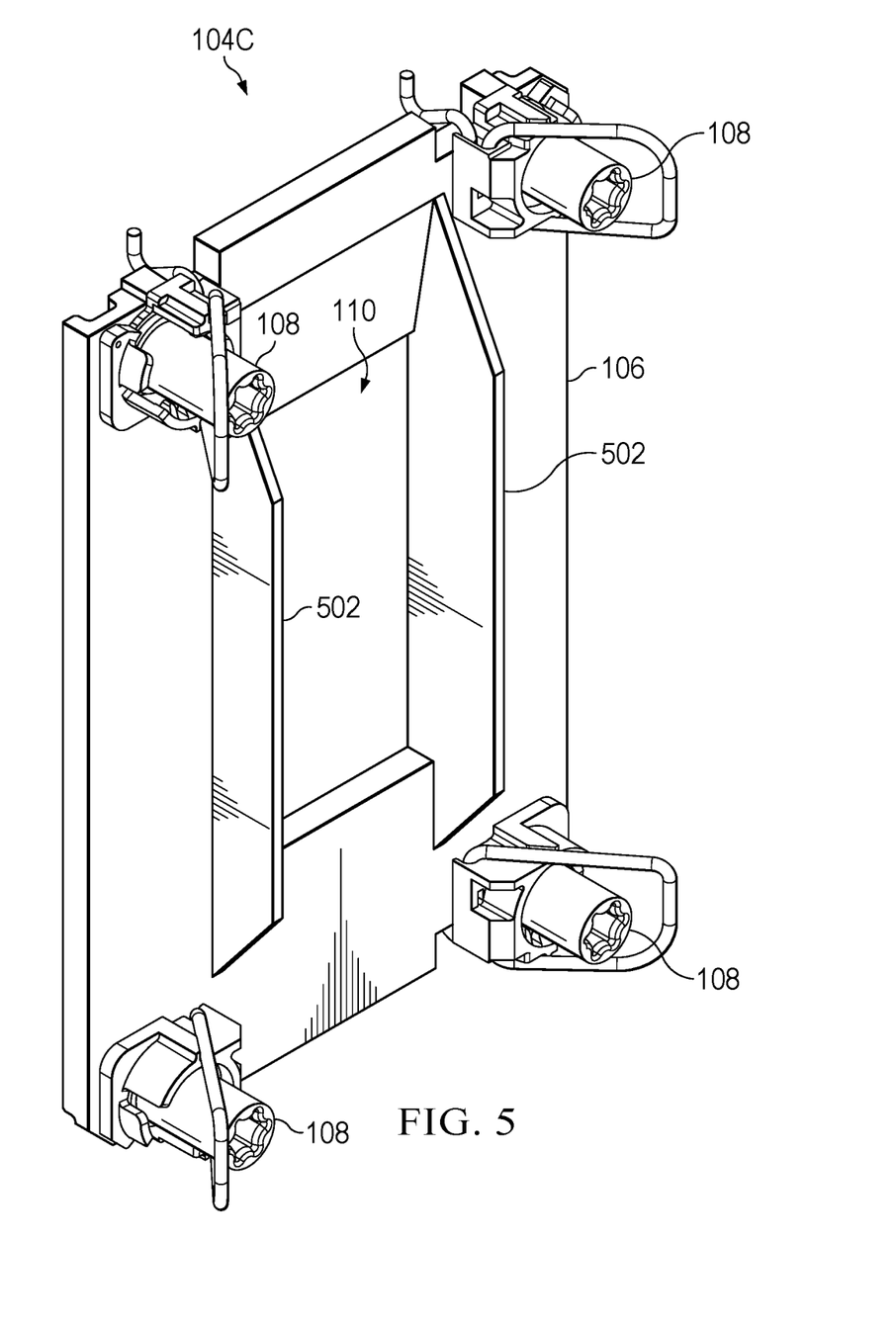
FIG. 5 illustrates an isometric perspective view of selected portions of yet another example load plate, in accordance with embodiments of the present disclosure.

FIG. 5 illustrates an isometric perspective view of selected portions of an example load plate 104C, in accordance with embodiments of the present disclosure. In some embodiments, load plate 104C may be used to implement load plates 104 depicted in FIGS. 1A and 1B. Load plate 104C depicted in FIG. 5 may be similar in many respects to load plate 104A depicted in FIG. 2. Accordingly, only the main difference between load plate 104A and load plate 104C may be described below.

In particular, load plate 104C may include stiffening features 502 extending from body 106 (in some embodiments at or near the perimeter of opening 110) and non-overlapping with respect to opening 110 so as to not obstruct or cover opening 110.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the FIGS. and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a motherboard;
   an information handling resource;
   a heat spreader thermally coupled to the information handling resource; and a load plate mechanically coupled to the motherboard in order to maintain electrical and mechanical coupling of the information handling resource to the motherboard, the load plate comprising:
- a body at least partially overlapping with and mechanically coupled to the heat spreader when the load plate is mechanically coupled to the motherboard;
- an opening formed within the body and configured to expose a surface of the heat spreader through the opening when the load plate is mechanically coupled to the motherboard; and
- an angled feature formed at one edge of a perimeter of the opening and decreasing in depth from the surface of the heat spreader to the body when the load plate is mechanically coupled to the motherboard.

2. The information handling system of claim 1, wherein the heat spreader includes an integrated boiling enhancement coating.

3. The information handling system of claim 1, the load plate further comprising a stiffening feature extending from the body at the perimeter of the opening and formed within the opening.

4. The information handling system of claim 1, the load plate further comprising a stiffening feature extending from the body and non-overlapping with the opening.

5. A load plate configured to mechanically couple to a motherboard in order to maintain electrical and mechanical coupling of an information handling resource to the motherboard, the load plate comprising:
- a body configured to at least partially overlap with and mechanically couple to a heat spreader thermally coupled to the information handling resource when the load plate is mechanically coupled to the motherboard;
- an opening formed within the body and configured to expose a surface of the heat spreader through the opening when the load plate is mechanically coupled to the motherboard; and
- an angled feature formed at one edge of a perimeter of the opening and decreasing in depth from the surface of the heat spreader to the body when the load plate is mechanically coupled to the motherboard.

6. The load plate of claim 5, the load plate further comprising a stiffening feature extending from the body at the perimeter of the opening and formed within the opening.

7. The load plate of claim 5, the load plate further comprising a stiffening feature extending from the body and non-overlapping with the opening.

8. A method for forming a load plate configured to mechanically couple to a motherboard in order to maintain electrical and mechanical coupling of an information handling resource to the motherboard, the method comprising:
- forming a body configured to at least partially overlap with and mechanically couple to a heat spreader thermally coupled to the information handling resource when the load plate is mechanically coupled to the motherboard;
- forming an opening within the body and configured to expose a surface of the heat spreader through the opening when the load plate is mechanically coupled to the motherboard; and
- forming an angled feature at one edge of a perimeter of the opening and decreasing in depth from the surface of the heat spreader to the body when the load plate is mechanically coupled to the motherboard.

9. The method of claim 8, further comprising forming a stiffening feature extending from the body at the perimeter of the opening and formed within the opening.

10. The method of claim 8, further comprising forming a stiffening feature extending from the body and non-overlapping with the opening.

* * * * *